United States Patent [19]

Takada et al.

[11] Patent Number: 5,350,606
[45] Date of Patent: Sep. 27, 1994

[54] SINGLE CRYSTAL FERROELECTRIC BARIUM TITANATE FILMS

[75] Inventors: Toshio Takada; Takahito Terashima; Kenji Iijima; Kazunuki Yamamoto; Kazuto Hirata, all of Kyoto; Yoshichika Bando, Shiga, all of Japan

[73] Assignees: Kanegafuchi Chemical Industry Co., Ltd., Osaka; Nippon Steel Corporation, Tokyo; Nec Corporation, Tokyo; Seisan Kaihatsu Kagaku Kenkyusho, Kyoto, all of Japan

[21] Appl. No.: 74,159

[22] Filed: Jun. 9, 1993

Related U.S. Application Data

[60] Division of Ser. No. 721,829, Jun. 26, 1991, which is a continuation-in-part of Ser. No. 500,247, Mar. 27, 1990, abandoned.

[30] Foreign Application Priority Data

Mar. 30, 1989 [JP] Japan .................................. 1-80700

[51] Int. Cl.$^5$ .................... B05D 3/06; C23C 16/00; C23C 14/00
[52] U.S. Cl. .................................... 427/564; 427/576; 427/561; 427/255.3; 204/192.2
[58] Field of Search ................. 501/137; 427/562, 564, 427/566, 567, 576, 255.1, 255.2, 255.3; 204/192.15, 192.2, 192.22, 192.25

[56] References Cited

U.S. PATENT DOCUMENTS

| | | | |
|---|---|---|---|
| 2,992,079 | 7/1961 | Linares, Jr. et al. | 501/137 |
| 3,409,412 | 11/1968 | Sasaki | 23/300 |
| 3,872,359 | 3/1975 | Feuersanger | 204/192.25 |
| 4,724,038 | 2/1988 | Pastor et al. | 423/598 |
| 5,006,363 | 4/1991 | Fujii et al. | 427/576 |
| 5,009,762 | 4/1991 | Maeno et al. | 204/192.16 |
| 5,077,270 | 12/1991 | Takeda et al. | 204/192.15 |
| 5,145,713 | 9/1992 | Venkatesan et al. | 427/561 |

FOREIGN PATENT DOCUMENTS 59-3091  1/1984  Japan .

OTHER PUBLICATIONS

Japanese abstract of 60-96599 May 30, 1985
Japanese abstract of 60-90893 May 22, 1985

Primary Examiner—Marianne Padgett
Attorney, Agent, or Firm—Wenderoth, Lind & Ponack

[57] ABSTRACT

A ferroelectric thin film consisting of a single crystal of $BaTiO_3$ which has a perovskite structure is produced by a method comprising evaporating Ba and Ti in an atomic ratio of 1:1 from discrete evaporation sources of Ba and Ti to deposit them on a substrate in a vacuum deposition vessel while supplying a small amount of an oxygen gas to the reactor.

9 Claims, 5 Drawing Sheets

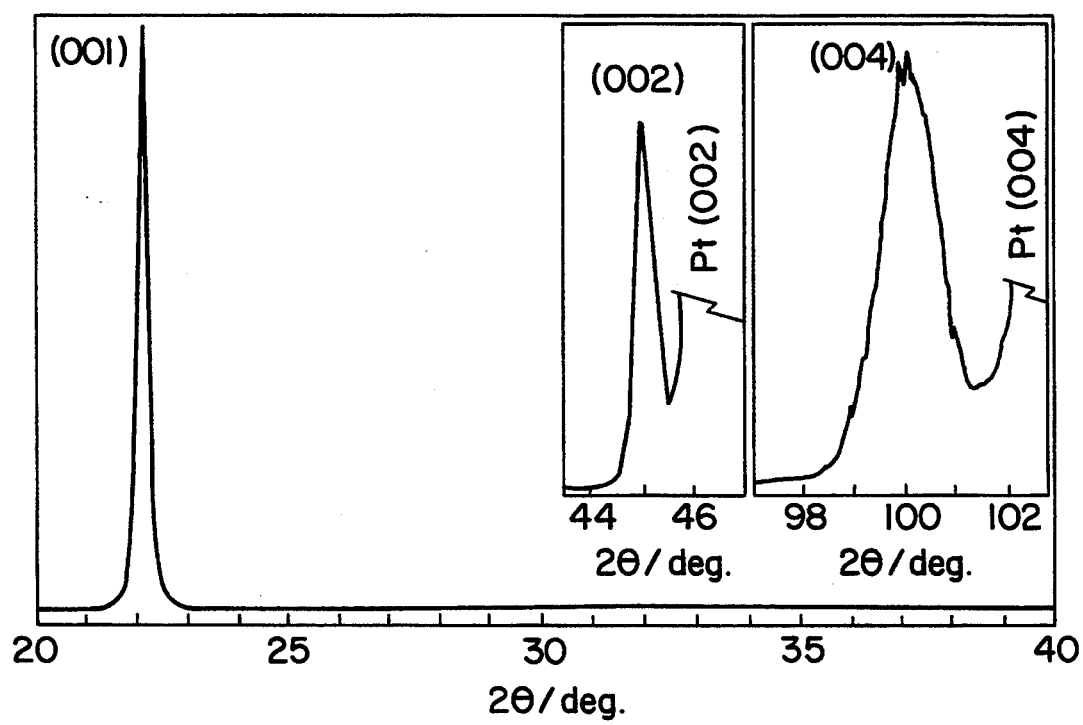
FIG. IC

[100]
[001]

[110]
[001]

[īl0]
[110]

SINGLE CRYSTAL FERROELECTRIC BARIUM TITANATE FILMS

This is a divisional application of Ser. No. 07/721,829, filed Jun. 26, 1991, which in turn is a continuation-in-part application of Ser. No. 500,247 filed on Mar. 27, 1990, now abandoned.

BACKGROUND OF THE INVENTION

1. Field of the Invention

The present invention relates to a ferroelectric thin film and a method for producing the same. In particular, the present invention relates to a ferroelectric thin film comprising a perovskite compound ($BaTiO_3$) and a method for producing the same. The present invention can be applied to a ferroelectric thin film element such as a memory element which utilizes reversal of polarization, a light switch which utilizes the electro-optical effect, a light modulation element, a light receiving element which utilizes the pyroelectric effect or a thin layer capacitor which utilizes a large dielectric constant.

2. Description of the Related Art

Hitherto, a $BaTiO_3$ thin layer has been prepared as a polycrystal thin layer by a vacuum deposition method comprising evaporating raw material oxides and depositing the thin layer, or a sputtering method (cf. Japanese Journal of Applied Physics, 24 (1985), supplement 24-2, 401–403 and Ferroelectrics, 37 (1981) 681–684).

Since $BaTiO_3$ exhibits ferroelectricity at a temperature of 120° C. or lower and has good ferroelectric and electro-optical characteristics, many proposals have been made on the application of $BaTiO_3$ to various devices. However, conventionally produced $BaTiO_3$ has the following defects:

The crystal structure of $BaTiO_3$ is a tetragonal system. Since its polarization axis is on the c axis, it has large anisotropy of properties between the c axis and other directions which are perpendicular to the c axis. Then, in some crystal orientations, various properties such as the reversal of polarization, the electro-optical effect and the pyroelectric effect cannot be used, and therefore, it is desired to use a material having a specific orientation depending on the kind of the device.

Since $BaTiO_3$ thin film prepared by the conventional production method is a polycrystal and its properties are averaged because of polycrystallinity, the thin film as a whole does not have good properties. Further, the polycrystal $BaTiO_3$ thin film requires high operation voltage.

Since the conventional $BaTiO_3$ is a polycrystal, it has grain boundaries and poor surface smoothness, the light is scattered at the grain boundary and the surface when it is used as an optical element. This leads to increase of propagation loss of the light.

The conventional vacuum evaporation method uses a so-called flash evaporation method in which a once sintered $BaTiO_3$ ceramics is ground to a particle size of several millimeters or less and several particles are dropped on a tungsten heater kept at 2000° C. or higher to evaporate the material.

Therefore, in such method, it is difficult to control the composition of the thin film, and contamination of the thin film with tungsten from the heater cannot be avoided. In addition, since it is difficult to control the conditions for growing the crystal, reproducibility and productivity of such method are not good.

In the sputtering method, it is not easy to produce a multi-component target such as $BaTiO_3$. Because of difference of sputtering rates among the elements, it is difficult to prepare a thin film having a homogeneous composition. Since evaporation rates are different among the elements due to the difference of sputtering rates and increase of temperature on the target surface caused by bombardment with argon ions, the composition on the target surface greatly changes as time passes. Further, since the formed thin film is exposed to the argon plasma, the crystallinity of the thin film is disturbed.

In addition, none of the $BaTiO_3$ thin films prepared by the above methods exhibits ferroelectricity in general. To prepare a ferroelectric $BaTiO_3$ thin film, a substrate should be heated to a temperature exceeding 1000° C. during formation of the thin film, or the formed thin film should be annealed at a temperature exceeding 1000° C. However, with such thin films, contamination with impurities or great decrease of electric resistance because of oxygen defects have been reported.

SUMMARY OF THE INVENTION

One object of the present invention is to provide a ferroelectric thin film consisting of a single crystal of $BaTiO_3$.

Another object of the present invention is to provide a method for producing such a single crystal ferroelectric thin film of $BaTiO_3$.

According to a first aspect of the present invention, there is provided a ferroelectric thin film having a thickness of not larger than 1 (one) $\mu m$ and consisting of a single crystal of $BaTiO_3$ which has a perovskite structure.

According to a second aspect of the present invention, there is provided a method for producing a ferroelectric thin film having a thickness of not larger than 1 (one) $\mu m$, which process comprises evaporating Ba and Ti in an atomic ratio of 1:1 from discrete evaporation sources of Ba and Ti to deposit them on a substrate in a vacuum deposition vessel while supplying a small amount of an oxygen gas to the reactor.

BRIEF DESCRIPTION OF THE DRAWINGS

FIGS. 1A, 1B and 1C are X-ray diffraction patterns of the $BaTiO_3$ thin films prepared in the Examples.

DETAILED DESCRIPTION OF THE DRAWINGS

Figure 1A:
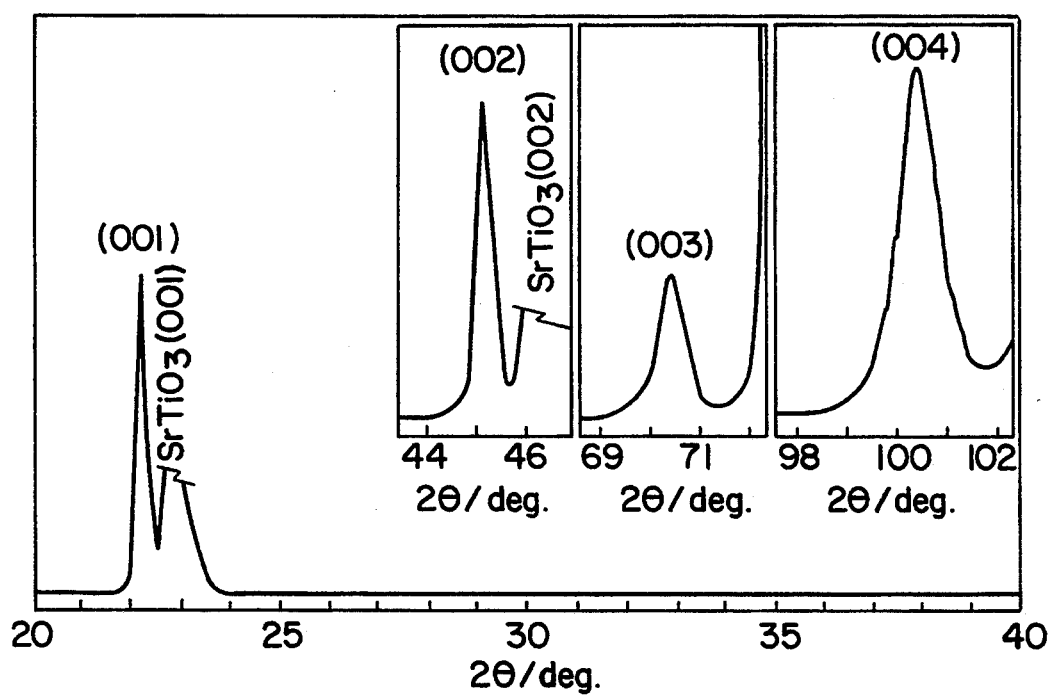

In the process of the present invention, a vacuum deposition vessel is evacuated to about $10^{-6}$ Torr. Then, the interior gas in the vessel is continuously exhausted and a small amount of an oxygen gas is continuously supplied in the vessel from a nozzle installed in the vessel to keep the oxygen pressure from $10^{-5}$ to $10^{-3}$ Torr. The reason why the upper limit of the oxygen gas pressure is selected to be $10^{-3}$ Torr is that Ba and Ti in the evaporation sources are constantly evaporated without deterioration of Ba and Ti in the evaporation sources. The lower limit of $10^{-5}$ Torr guarantees stable oxidation of the metal elements on the substrate. When the plasma is generated in the vessel, $10^{-5}$ Torr. is the minimum gas pressure for constantly generating the plasma.

Preferably, the oxygen gas is supplied towards the substrate surface from a distance close to the substrate to form an oxygen-containing atmosphere having a relatively high pressure near the substrate. Thereby, the reaction on the substrate can be accelerated with a smaller amount of the oxygen gas. Since the interior gas of the vessel is continuously exhausted, almost all the parts in the vessel are kept at a low pressure of $10^{-4}$ to $10^{-6}$ Torr.

The plasma can be generated by placing a high frequency coil between the evaporation sources and the substrate and oscillating it between the coil and the vessel wall at high frequency. While the plasma generation is preferred since reaction activities of the evaporated metals and oxygen atoms are increased, it may have some drawbacks such that, if the plasma energy is too high, the plasma disturbs the crystallinity of the thin film which is being formed. Therefore, the electric power for generating the plasma is preferably in the range from 50 to 500 W, preferably around 100 W.

Under the above conditions, the metal elements are deposited on the substrate to grow the thin film while controlling the evaporated amounts. To crystallize $BaTiO_3$, the substrate is preferably heated at a temperature not lower than 500° C. When the substrate temperature is too high, the surface smoothness of the thin film is deteriorated. Then, the substrate temperature is more preferably around 600° C.

Ba and Ti metals are evaporated by electron beams and the like. Before the deposition of the $BaTiO_3$ thin film, the amount of metal Ba or Ti metal evaporated and the amount of oxide BaO or $TiO_2$ formed by the specific electric power applied to each evaporation source per unit time are measured by a film thickness measuring device installed in the vacuum deposition vessel near the substrate for each metal. Thereby, a relationship between the evaporation rate of each metal and the applied electric power is established and then the electric power to be applied to each evaporation source during formation of the thin film of $BaTiO_3$ is determined.

When the evaporation rates are so adjusted that a deposition rate of $BaTiO_3$ is several angstrom/sec. or less, preferably 4 Å/sec. or less, a single crystallized thin film is well formed. At a larger deposition rate, the film is formed without sufficient migration of the atoms on the substrate so than a polycrystal thin film is generated.

The thickness of the formed ferroelectric thin film is preferably from 0.05 to 1 μm.

In comparison with the conventional vacuum deposition method or the sputtering method, the process of the present invention can be carried out under such easily controllable conditions that the contamination with impurities can be avoided. Therefore, the present invention can provide a ferroelectric thin film having good completeness with improved reproducibility.

PREFERRED EMBODIMENTS OF THE INVENTION

The present invention will be explained in further detail by following Examples.

EXAMPLES

As the substrates on which the thin films were grown, the following substrates were used:
(1) A $SrTiO_3$ single crystal which was cut so that its surface had a (001) plane and planished.
(2) A $SrTiO_3$ single crystal which was cut so that its surface had a (110) plane and planished.
(3) A MgO single crystal which was cut so that its surface had a (001) plane and planished, on which a thin film of Pt single crystal with a thickness of 1000 Å being oriented in the (001) direction was formed by the vacuum deposition method using a piece of Pt metal as an evaporation source.

The substrate (ca. 15 mm × ca. 15 mm) was fixed on a substrate holder which was equipped with a heating mechanism and installed in a vacuum vessel having a diameter of 750 mm and a height of 1000 mm. Then, the vacuum vessel was evacuated to $10^{-6}$ Torr by an oil diffusion pump, and the substrate was heated to 600° C.

From nozzles installed in the vacuum vessel, oxygen gas was supplied at a flow rate of 40 cc/min.

Ba and Ti metals were evaporated from independent evaporation sources at such evaporation rates that the atomic ratio of Ba:Ti was 1:1 on the substrate. For example, Ba and Ti were evaporated at rates of 1.36 Å/sec. and 1.0 Å/sec., respectively.

Between the substrate and the evaporation sources, a high-frequency coil was placed, and high frequency (13.56 MHz) was applied at 100 W so as to generate oxygen plasma, which accelerated the reactions on the substrate.

During the reaction, the pressure in the vessel was about $10^{-4}$ Torr.

Under the above conditions, a $BaTiO_3$ thin film having a thickness of 4000 Å was formed on each of the substrates.

Figure 1B:
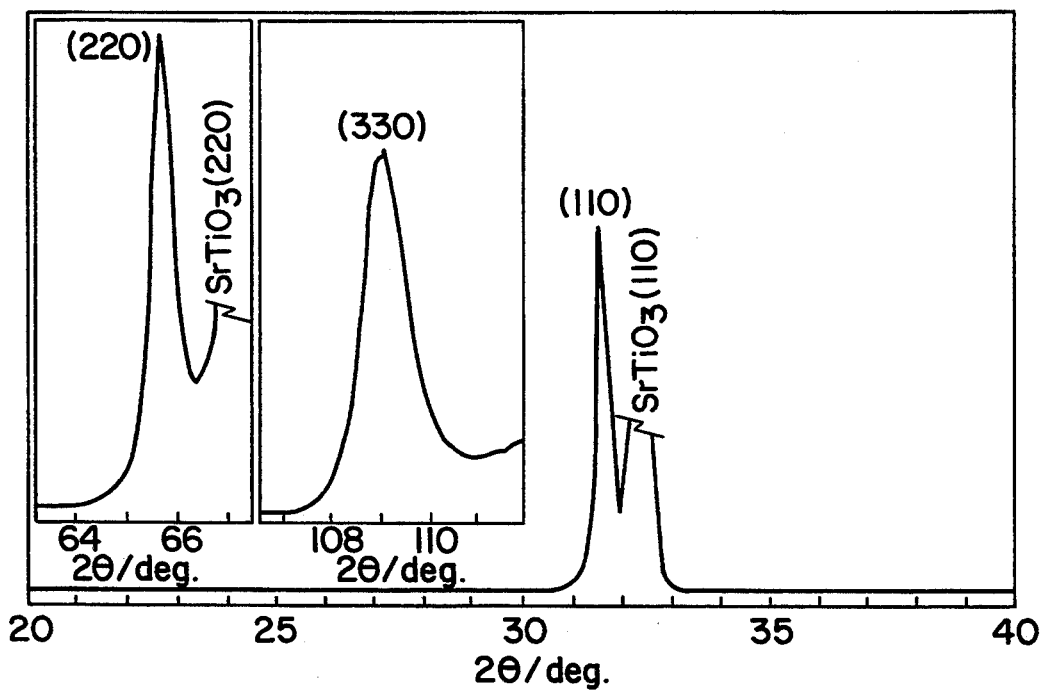

X-ray diffraction patterns of the thin films formed on the substrates (1), (2) and (3) are shown in FIGS. 1A, 1B and 1C, respectively.

In FIGS. 1A and 1C, the peak corresponding to the (001) plane of the perovskite structure is clearly observed. In FIG. 1B, the peaks corresponding to the (110), (220) and (330) planes are clearly observed. These peaks indicate that the thin film had strong orientation in the direction which reflected the crystal structure and symmetry of the substrate.

RHEED patterns of the formed thin films are shown in FIGS. 2A to 2F.

Figure 2A:
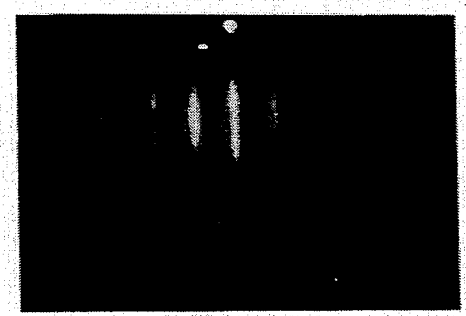
FIGS. 2A, 2B, 2C, 2D, 2E and 2F are reflecting high energy electron diffraction (hereinafter referred to as "RHEED") photographs of the $BaTiO_3$ thin films prepared in the Examples.
Figure 2B:

FIGS. 2A and 2B are patterns for the thin film formed on the substrate (1) when the electron beam was incident on the thin film from the [010] and [110] directions of the substrate, respectively.

Figure 2C:
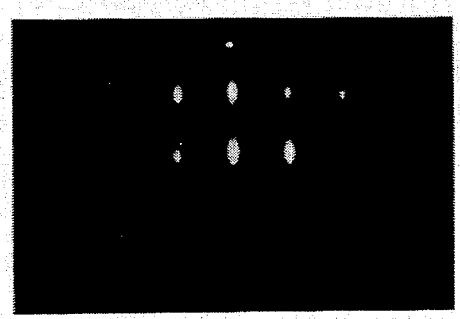
Figure 2D:
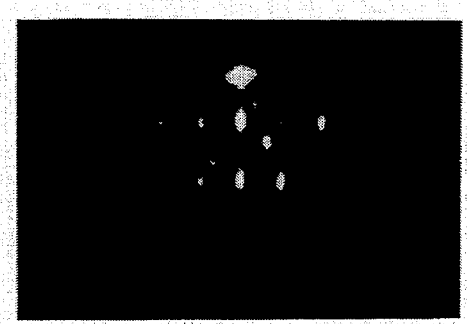

FIGS. 2C and 2D are patterns for the thin film formed on the substrate (2) when the electron beam was incident on the thin film from the [001] and [110] directions of the substrate, respectively.

Figure 2E:
Figure 2F:
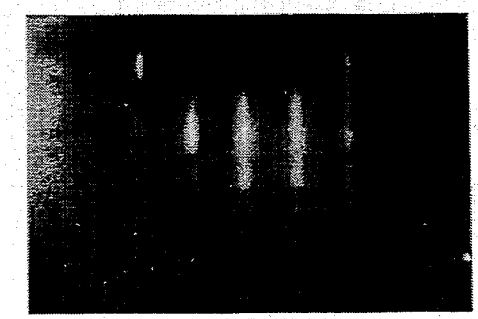

FIGS. 2E and 2F are patterns for the thin film formed on the substrate (3) when the electron beam was incident on the thin film from the [010] and [001] directions of the substrate, respectively.

As understood from the above results, $BaTiO_3$ was epitaxially grown on the substrate. Since its electron diffraction pattern was in a sharp streak form, all the formed thin films were single crystals and their surfaces were smooth at the atomic level. These results were confirmed by observation of the thin film surfaces with a scanning type electron microscope, by which no grain boundary was found.

Figure 3:
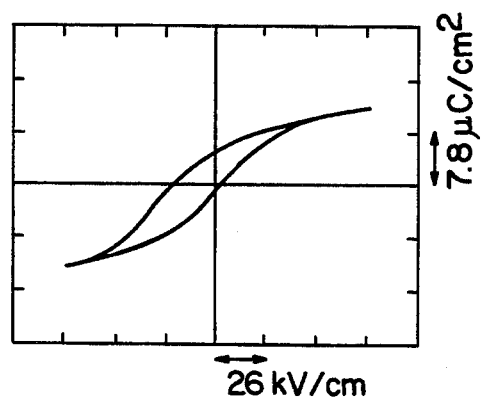
FIG. 3 is a ferroelectric hysteresis loop of a $BaTiO_3$ thin film prepared in one of Examples.

All the thin films had high resistivity of $10^9$ ohm.cm or larger. With the formed thin films, ferroelectric hysteresis loops which indicate that the films had the ferroelectric property were observed. FIG. 3 shows an example of the hysteresis loops observed at a frequency of 60 Hz, which loop was a clear ferroelectric hysteresis loop having remanence Pr of about 5 $\mu C/cm^2$ and electric field resistance of 15 KV/cm.

Figure 4:
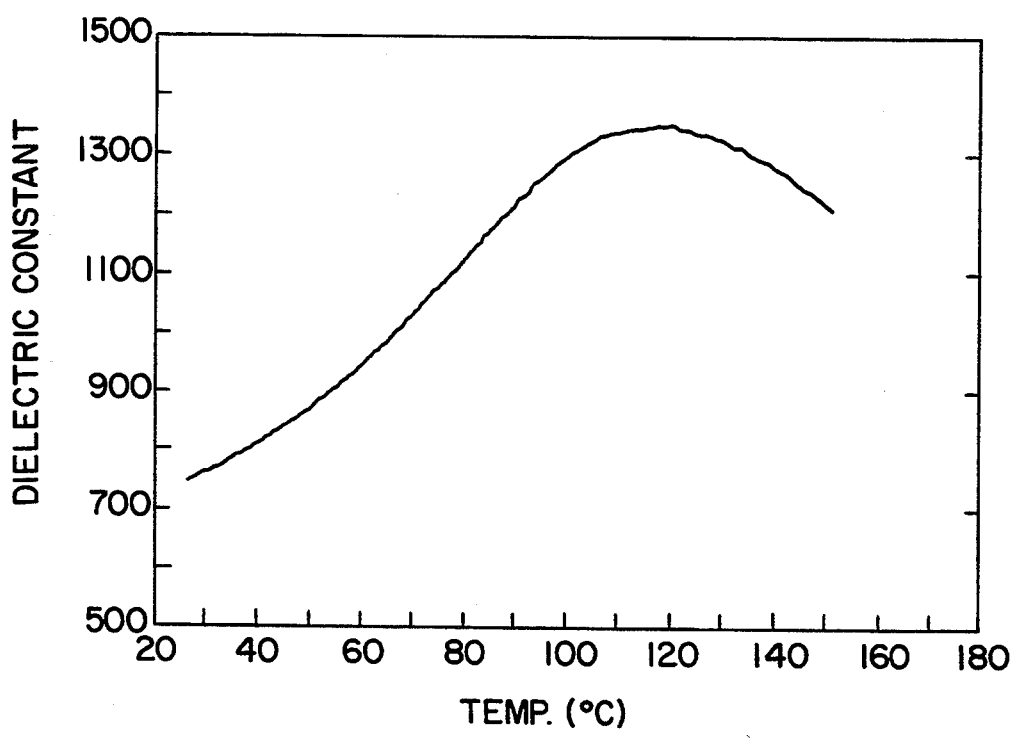
FIG. 4 is a graph showing the dependency of dielectric constant on temperature change of a $BaTiO_3$ thin film prepared in one of the Examples.

Dependence of the dielectric constant on temperature was examined. As seen from FIG. 4 showing an example of the results, a broad but clear peak was observed around 120° C. This means that, at this temperature, ferroelectric phase transition in this thin film occurred.

In the same manner as above but supplying the oxygen gas at a flow rate of 25 cc/min. from a distance close to the substrate surface to generate an oxygen-containing atmosphere having relatively high oxygen pressure near the substrate surface, a $BaTiO_3$ thin film was grown. The properties of the thin film were substantially the same as above.

What is claimed is:

1. A method for producing a substantially single crystal ferroelectric thin film having a thickness of not larger than 1 $\mu m$, which method comprises evaporating Ba and Ti in an atomic ratio of 1:1 from discrete evaporation sources of Ba and Ti to deposit the evaporated Ba and Ti on a substrate in a vacuum deposition vessel while supplying oxygen gas in an amount sufficient to maintain oxygen pressure within the vessel between $10^{-5}$ and $10^{-3}$ Torr.

2. The method according to claim 1, wherein a plasma is generated during evaporation of Ba and Ti and deposition of $BaTiO_3$ on the substrate.

3. The method according to claim 1, wherein said oxygen gas is supplied towards the substrate surface to form an oxygen-containing atmosphere having a relatively high pressure near the substrate.

4. The method according to claim 1, wherein a single crystal is used as the substrate with its (001) plane forming the substrate surface.

5. The method according to claim 1, wherein a single crystal is used as the substrate with its (110) plane forming the substrate surface.

6. The method according to claim 1, wherein the substrate is heated at a temperature not lower than 500° C.

7. The method according to claim 1, wherein a deposition rate of $BaTiO_3$ is 4 Å/sec. or less.

8. The method according to claim 1, wherein the ferroelectric thin film thus produced comprises a single crystal of $BaTiO_3$ having a perovskite structure.

9. The method according to claim 6, wherein the ferroelectric thin film thus produced consists of a single crystal of $BaTiO_3$ having a perovskite structure.

* * * * *